United States Patent
Huang

[19]

[11] Patent Number: 5,922,136
[45] Date of Patent: Jul. 13, 1999

[54] POST-CMP CLEANER APPARATUS AND METHOD

[75] Inventor: Ying-Shih Huang, Hsin-Chu, Taiwan

[73] Assignee: Taiwan Semiconductor Manufacturing Company, Ltd., Hsin-Chu, Taiwan

[21] Appl. No.: 08/827,211

[22] Filed: Mar. 28, 1997

[51] Int. Cl.⁶ .............................. B08B 3/04; B08B 3/00
[52] U.S. Cl. .................. 134/2; 134/29; 134/95.2
[58] Field of Search ............... 134/2, 6, 29, 95.2, 134/149; 156/636

[56] References Cited

U.S. PATENT DOCUMENTS

| | | | |
|---|---|---|---|
| 4,050,954 | 9/1977 | Basi | 134/2 |
| 4,401,131 | 8/1983 | Lawson | 134/149 |
| 5,049,200 | 9/1991 | Brunner et al. | 134/2 |
| 5,078,801 | 1/1992 | Malik | 134/29 |
| 5,311,893 | 5/1994 | Nishi | 134/95.2 |
| 5,320,706 | 6/1994 | Blackwell | 156/636 |
| 5,442,828 | 8/1995 | Lutz | 15/88.3 |
| 5,478,436 | 12/1995 | Winebarger et al. | 156/636.1 |
| 5,551,986 | 9/1996 | Jain | 134/6 |
| 5,704,987 | 1/1998 | Huynh | 134/6 |

*Primary Examiner*—Jill Warden
*Assistant Examiner*—Yolanda E. Wilkins
*Attorney, Agent, or Firm*—George O. Saile; Stephen B. Ackerman

[57] ABSTRACT

An improved and new apparatus and method for post chemical-mechanical planarization (CMP) cleaning has been developed. Use of a QDR (Quick Dump Rinse) DI water bath for receiving a cassette of semiconductor substrates from a previous CMP processing station, for keeping the semiconductor substrates submerged in DI water following CMP and before transmission to a next processing station and for performing at least one rinsing and dumping operation on the semiconductor substrates in flowing DI water greatly enhances the manufacturing throughput of the process, reduces the use of chemicals, and simplifies the tool requirements for the post-CMP cleaning process.

6 Claims, 1 Drawing Sheet

POST-CMP CLEANER APPARATUS AND METHOD

BACKGROUND OF THE INVENTION (1) Field of the Invention

This invention relates to an apparatus and method of fabrication used for semiconductor integrated circuit devices, and more specifically to an improved apparatus and process for post chemical-mechanical polishing (CMP) cleaning.

(2) Description of Related Art

Chemical-mechanical polishing (CMP) has been developed for providing smooth planar topographies on surfaces deposited on semiconductor substrates. For example, rough topography results when metal conductor lines are formed over a substrate containing device circuitry. The metal conductor lines serve to interconnect discrete devices, and thus form integrated circuits. The metal conductor lines are further insulated from the next interconnection level by layers of insulating material and holes formed through the insulating layers provide electrical access between successive conductive interconnection layers. In such wiring processes, it is desirable that the insulating layers have a smooth surface topography, since it is difficult to lithographically image and pattern layers applied to rough surfaces. CMP can, also, be used to remove different layers of material from the surface of a semiconductor substrate. For example, following via hole formation in an insulating material layer, a metallization layer is blanket deposited and then CMP is used to produce planar metal studs.

Briefly, the CMP processes involve holding and rotating a thin, flat substrate of the semiconductor material against a wetted polishing surface under controlled chemical, pressure and temperature conditions. A chemical slurry containing a polishing agent, such as alumina or silica, is used as the abrasive material. In addition, the chemical slurry contains selected chemicals which etch various surfaces of the substrate during processing. The combination of mechanical and chemical removal of material during polishing results in superior planarization of the polished surface.

The CMP process leaves a contaminant layer on the surfaces of the semiconductor substrate. This contaminant layer comprises substantially abrasive particles from the polishing slurry and may consist of alumina or silica particles saturated with chemicals added to the polishing slurry. In addition, the contaminant layer may comprise reaction products of the polishing slurry and the polished surfaces. It is necessary to remove the contaminant layer prior to subsequent processing of the semiconductor substrate in order to avoid degradation in device reliability and introduction of defects which reduce the manufacturing process yield.

U.S. Pat. No. 5,442,828 entitled "Double-Sided Wafer Scrubber With a Wet Submersing Silicon Wafer Indexer" granted Aug. 22, 1995 to Rick A. Lutz describes a wet indexer apparatus, including a tank for pre-soaking semiconductor wafer substrates in a solution before transferring the wafer substrates to a subsequent processing operation.

U.S. Pat. No. 5,478,436 entitled "Selective Cleaning Process For Fabricating a Semiconductor Device" granted Dec. 26, 1995 to Paul M. Winebarger et al describes a post-CMP cleaning process for semiconductor substrates in which a solution of an organic solvent and a fluorine containing compound removes metal contaminants from the suface of the semiconductor substrates.

While these inventions result in improvements to the CMP process they do not address overall manufacturing concerns, and therefore do not provide an effective, low-cost, high throughput post-CMP cleaning process.

The present invention is directed to a novel and improved apparatus and method for post chemical-mechanical polishing (CMP) cleaning.

SUMMARY OF THE INVENTION

One object of the present invention is to provide a new and improved apparatus and method of cleaning semiconductor substrates following CMP (Chemical-Mechanical Polishing) of the semiconductor substrates.

Another object of the present invention is to provide a new and improved apparatus and method of cleaning semiconductor substrates following CMP, whereby manufacturing process throughput is increased and manufacturing cost is reduced.

A further object of the present invention is to provide a new and improved apparatus and method of cleaning semiconductor substrates following CMP, whereby consumption of chemicals used in subsequent cleaning steps is reduced, thereby reducing manufacturing cost through reduced chemical usage and reduced disposal costs.

Still another object of the present invention is to provide a new and improved apparatus and method of cleaning semiconductor substrates following CMP, utilizing simplified cleaning tools requiring less floor space, thereby conserving costly clean room space, and thus reducing manufacturing cost.

In accordance with the present invention, the above and other objectives are realized by using a method of post-CMP cleaning semiconductor substrates comprising the steps of: receiving from a previous CMP processing station a semiconductor substrate having thereon a contaminant layer resulting from the CMP process; rinsing the semiconductor substrate having thereon a contaminant layer resulting from the CMP process in a first flowing DI water bath; disposing of the flowing DI water from the first flowing DI water bath after rinsing the semiconductor substrate; applying to the semiconductor substrate a chemical cleaning solution; rinsing the semiconductor substrate in a second flowing DI water bath; disposing of the flowing DI water from the second flowing DI water bath after rinsing the semiconductor substrate; and drying the semiconductor substrate. The method of the invention is performed in an apparatus comprising: a first QDR (Quick Dump Rinse) DI water bath for receiving a cassette of semiconductor substrates from a previous CMP processing station, for keeping the semiconductor substrates submerged in DI water following CMP and before transmission to a next processing station and for performing at least one rinsing and dumping operation on the semiconductor substrates in flowing DI water; a loader mechanism for transferring the semiconductor substrates from the cassette to a single substrate processing chuck; a chuck clean bath for cleaning the single substrate processing chuck; a chemical bath for receiving semiconductor substrates; a second QDR (Quick Dump Rinse) DI water bath for receiving semiconductor substrates from the chemical bath and for performing at least one rinsing and dumping operation on the semiconductor substrates in flowing DI water; a semiconductor substrate dryer; and an unloader mechanism for transferring the semiconductor substrates from the single substrate processing chuck to a cassette.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
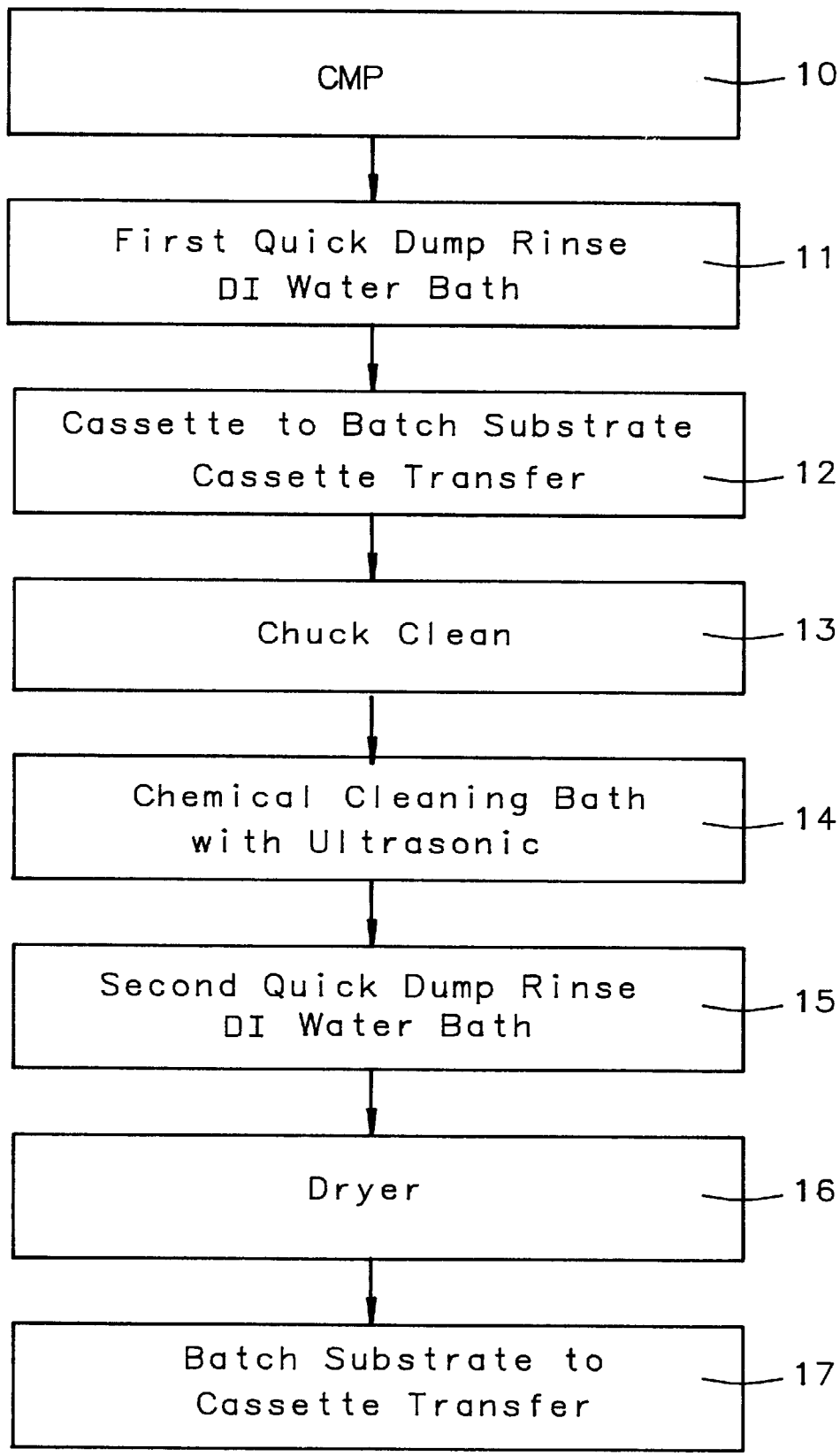
FIG. 1, which is a flow chart of the method of the preferred embodiment of the present invention.

A manufacturing process for semiconductor integrated circuits must meet multiple criteria: 1) Individual process steps must produce the desired result; 2) A process step must be compatible with both previous and subsequent process steps; 3) Process steps must yield high manufacturing throughput in order to reduce product cost; 4) Consumption of process ingredients, such as chemicals and tool parts should be minimized; 5) Waste product production should be minimized; 6) Process tool foot-print should be minimized in order to conserve high-cost clean room space; 7) Overall process yield and product reliability must be maximized by reducing defect induced yield and reliability detractors.

It is particularly important to consider all these criteria when specifying a semiconductor manufacturing process utilizing chemical-mechanical polishing (CMP) to produce planarized and smooth surfaces on semiconductor substrates. CMP is an effective process for planarizing surfaces and meets the criteria for low cost and high process step yield. However, the substrate cleaning step which must follow the CMP step is particularly critical, since substantial contaminants remain on the substrate surfaces following CMP. It is, therefore, necessary to have a post-CMP cleaning process which effectively removes the contaminants at low cost, high cleaning process throughput, and with high overall process yield.

The new and improved method for post-CMP cleaning semiconductor substrates will now be described in detail. Referring to FIG. 1, which is a flow chart of the method of the preferred embodiment of the present invention, CMP Step 10 is performed by conventional means. For example, CMP may be performed using a polishing slurry containing alumina or silica abrasive particles in an alkaline solution containing KOH. At the end of the CMP operation the semiconductor substrates are wet and covered with polishing slurry and reaction products from the polishing process. Allowing the polishing slurry to dry on the semiconductor substrates is to be avoided, because dried slurry is significantly more difficult to remove. Therefore, it is important to keep the semiconductor substrates wet and then to quickly clean the substrates to remove the contaminants resulting from the CMP process. As shown in FIG. 1, Step 11 loads a cassette of polished semiconductor substrates containing polishing slurry contaminants on the surfaces thereof into a first QDR (Quick Dump Rinse) DI water bath for keeping the semiconductor substrates submerged in DI water following CMP and before transmission to a next processing station and for performing at least one rinsing and dumping operation on the semiconductor substrates in flowing DI water. The QDR DI water bath is particularly effective in removing polishing slurry contaminants from the semiconductor substrate surfaces because of vigorous DI water spraying, flowing DI water during a rinse-soak cycle, and quick dump of the DI water which flushes away slurry contaminants removed from the surfaces of the semiconductor substrates. Multiple spray/overflow rinse/dump cycles may be performed in order to achieve the desired cleanliness level. The introduction of this first QDR DI water bath into the post-CMP cleaning process sequence is of critical importance because it is particularly effective in removing a major portion of the slurry contaminants residing on the substrates immediately following CMP. This results in improved process yield because defects induced by residual contaminants are reduced. Furthermore, fewer contaminants are introduced into subsequent process baths, such as chemical cleaning baths, and thereby prolong the useful life of these chemical baths. Processing cost is reduced by lowering the cost of consummable chemicals and lowering the cost of disposing of contaminated chemical baths.

Again referring to FIG. 1, Step 12 transfers a semiconductor substrate from the cassette to a single substrate processing chuck. A chuck cleaning bath, Step 13, comprising DI (deionized) water, at a temperature between about 22 and 80° C., permits the single substrate chuck to be cleaned prior to receiving a new substrate from the loading cassette. Step 14 introduces the semiconductor substrate into a chemical cleaning bath comprising a solution of APM (Ammonia Peroxide Mixture). The APM (Ammonia Peroxide Mixture) comprises $NH_4OH$, $H_2O_2$ and DI water and the volume ratios are in a range between about 0.2:1:5 to 1:1:5 for the three components. The APM may be heated from about 22 to 80° C. Alternately, the chemical cleaning bath may be DHF (diluted HF) in DI water, having a concentration between about 0.2% and 1.0%, at a temperature between about 22 and 80° C. The chemical cleaning bath includes a means of applying ultrasonic agitation to the semiconductor substrate during submersion of the semiconductor substrate in the chemical bath. Step 15 introduces the semiconductor substrate into a second QDR (Quick Dump Rinse) DI water bath and performs at least one rinsing and dumping operation on the semiconductor substrate in flowing DI water. The next operation, Step 16, drys the semiconductor substrate, using a a spin dryer mechanism in the presence of a flow of nitrogen gas, an IPA (Isopropyl alcohol) vapor dryer means, or an alternate substrate drying means. Finally, Step 17 transfers the semiconductor substrate from the single substrate processing chuck to a cassette.

Removal of the major portion of the CMP slurry contaminants on the surfaces of semiconductor substrates in the batch mode (cassette of substrates) via Step 11 in the first QDR (Quick Dump Rinse) DI water bath greatly improves the throughput of the manufacturing process for post-CMP cleaning. Use of a single substrate, single stage chemical scrubber in place of the QDR DI water bath reduces the process throughput by about a factor of four and therefore adds cost to the process. Furthermore, the use of the first QDR DI water bath serves the dual purposes of: 1) Keeping substrates wet following CMP and 2) Removing a major portion of the post-CMP contaminants. Therefore, it is unnecessary to introduce more complicated and costly two stage cleaning processes which utilize a combination of spray cleaning followed by scrubber cleaning. The result, using the first QDR DI water bath, is simplified processing, less costly tools, and reduced tool foot-print, thereby conserving costly clean room space.

While the invention has been particularly shown and described with reference to the preferred embodiments thereof, it will be understood by those skilled in the art that various changes in form and details may be made without departing from the spirit and scope of the invention.

What is claimed is:

1. A method of post-CMP cleaning semiconductor substrates comprising:

receiving a cassette of semiconductor substrates from a previous CMP processing station;

loading said cassette of semiconductor substrates into a first QDR (Quick Dump Rinse) DI water bath station;

performing at least one rinsing and dumping operation on said cassette of semiconductor substrates in flowing DI water in said first QDR (Quick Dump Rinse) DI water bath station;

receiving said cassette of semiconductor substrates from said first QDR (Quick Dump Rinse) DI water bath station and transferring a semiconductor substrate from said cassette to a single substrate processing chuck:

applying to said semiconductor substrate on the single substrate processing chuck a chemical cleaning solution;

loading said semiconductor substrate on the single substrate processing chuck into a second QDR (Quick Dump Rinse) DI water bath station;

performing at least one rinsing and dumping operation on said semiconductor substrate on the single substrate processing chuck in flowing DI water in said second QDR (Quick Dump Rinse) DI water bath station;

drying said semiconductor substrate on the single substrate processing chuck; and transferring said semiconductor substrate from the single substrate processing chuck to a cassette.

2. The method of claim 1, wherein said chemical cleaning solution comprises a solution of APM (Ammonia Peroxide Mixture) containing $NH_4OH$, $H_2O_2$ and DI water, having a concentration between about 0.2:1:5 and 1:1:5, at a temperature between about 22 and 80° C.

3. The method of claim 1, wherein said chemical cleaning solution comprises a solution of DHF (Diluted HF), having a concentration between about 0.2% and 1.0%, at a temperature between about 22 and 80° C.

4. The method of claim 1, wherein said chemical cleaning solution is applied in the presence of ultrasonic agitation energy.

5. The method of claim 1, wherein drying said semiconductor substrate comprises spin drying the semiconductor substrate while applying a flow of nitrogen gas.

6. The method of claim 1, wherein drying said semiconductor substrate comprises application of IPA (Isopropyl alcohol) vapor.

* * * * *